United States Patent
Ichikawa et al.

(10) Patent No.: US 6,831,530 B2
(45) Date of Patent: Dec. 14, 2004

(54) MONOLITHIC LC FILTER WITH ENHANCED MAGNETIC COUPLING BETWEEN RESONATOR INDUCTORS

(75) Inventors: Junichi Ichikawa, Ise (JP); Tadashi Shingaki, Ise (JP); Norihisa Kitajima, Ise (JP)

(73) Assignee: NKG Spark Plug Co., Ltd., Nagoya (JP)

( * ) Notice: Subject to any disclaimer, the term of this patent is extended or adjusted under 35 U.S.C. 154(b) by 67 days.

(21) Appl. No.: 10/397,233

(22) Filed: Mar. 27, 2003

(65) Prior Publication Data

US 2003/0184411 A1 Oct. 2, 2003

(30) Foreign Application Priority Data

Mar. 29, 2002 (JP) .......................................... 2002-097130

(51) Int. Cl.$^7$ .............................................. H03H 7/075
(52) U.S. Cl. ........................................ 333/184; 333/185
(58) Field of Search .................................. 333/184, 185, 333/180, 140, 175

(56) References Cited

U.S. PATENT DOCUMENTS 6,542,052 B2 * 4/2003 Matsumura et al. ......... 333/175
6,762,654 B1 * 7/2004 Tanaka ....................... 333/140

FOREIGN PATENT DOCUMENTS

JP              6053704          2/1994

* cited by examiner

Primary Examiner—Linh M. Nguyen
(74) Attorney, Agent, or Firm—Stites & Harbison PLLC; Ross F. Hunt, Jr.

(57) ABSTRACT

A monolithic LC filter which provides increased magnetic field coupling as compared with a conventional monolithic LC filter, without an increase in component size of the filter. The monolithic LC filter includes first and second resonator inductors coupled together by magnetic field coupling. The inductors include parallel-extending straight coupling sections formed by conductive lines which extend in parallel generally along a diagonal of a supporting dielectric layer. This configuration enables the lengths of the coupling sections to be increased as compared with the lengths of the corresponding coupling sections of a conventional monolithic LC filter.

5 Claims, 7 Drawing Sheets

MONOLITHIC LC FILTER WITH ENHANCED MAGNETIC COUPLING BETWEEN RESONATOR INDUCTORS

BACKGROUND OF THE INVENTION

1. Field of the Invention

The present invention relates to a monolithic LC filter to be used in mobile communication devices such as cellular telephones.

2. Related Art

Figure 5:
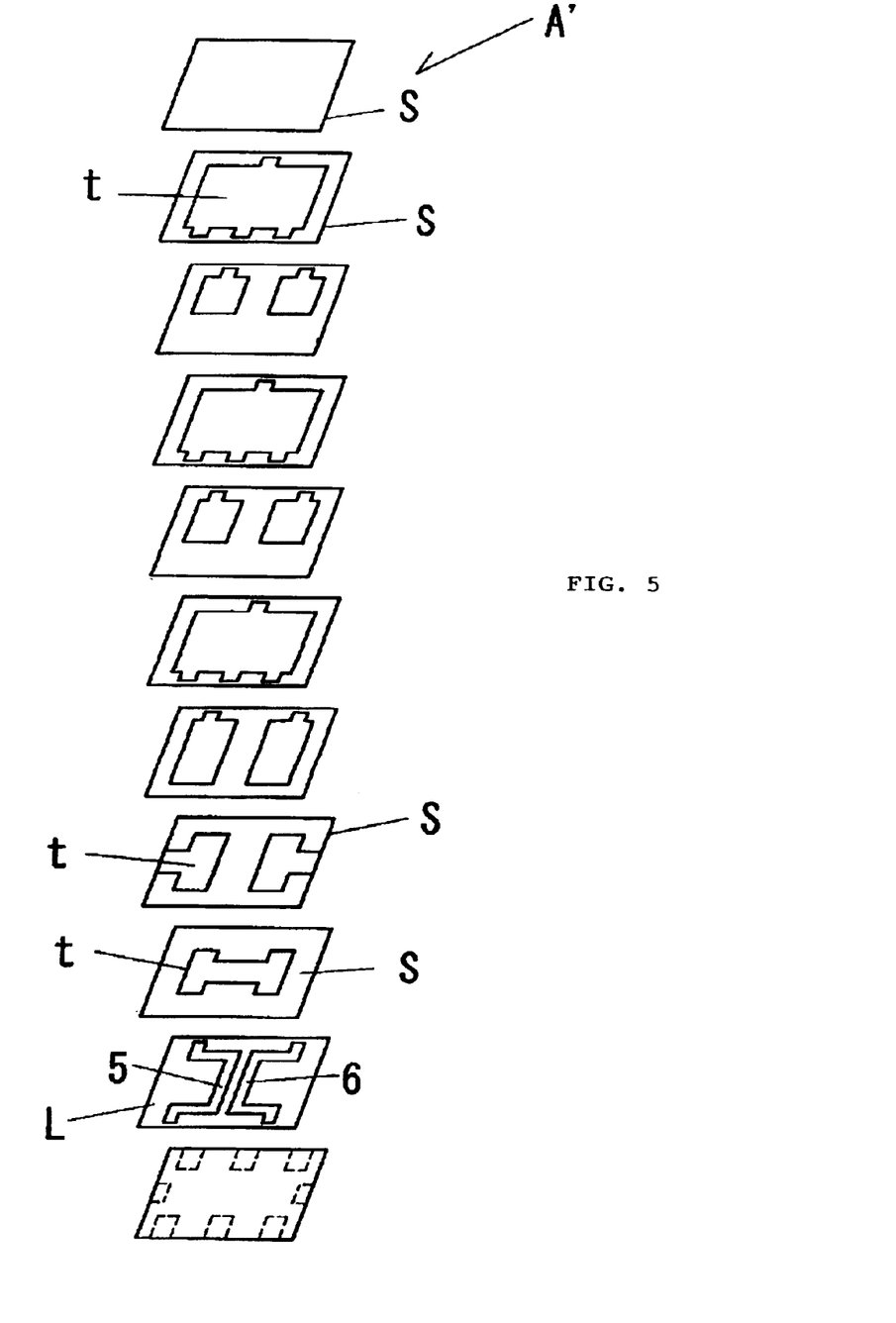
FIG. 5, which was described above, is an exploded perspective view of a conventional monolithic LC filter.

Various conventional miniaturized, small-loss monolithic LC filters suitable for mass production have been proposed and have been used in mobile communication devices such as cellular telephones. Such a monolithic LC filter typically includes a first LC resonance circuit including a first resonator inductor, and a second LC resonance circuit including a second resonator inductor. A conventional monolithic LC filter is shown in FIG. 5, wherein a monolithic LC filter A' is configured in such a manner that a plurality of electrodes or conductor patterns t of various shapes are laminated together with dielectric layers S interposed therebetween. More specifically, the monolithic LC filter A' of FIG. 5 has a rectangular parallelepiped shape that is fabricated through a process in which a conductor pattern or conductor patterns (corresponding to electrodes t) are formed on each of a plurality of rectangular dielectric sheets (corresponding to dielectric layers 5), the plurality of dielectric sheets are laminated, and the resultant laminated body is fired.

Figure 6:
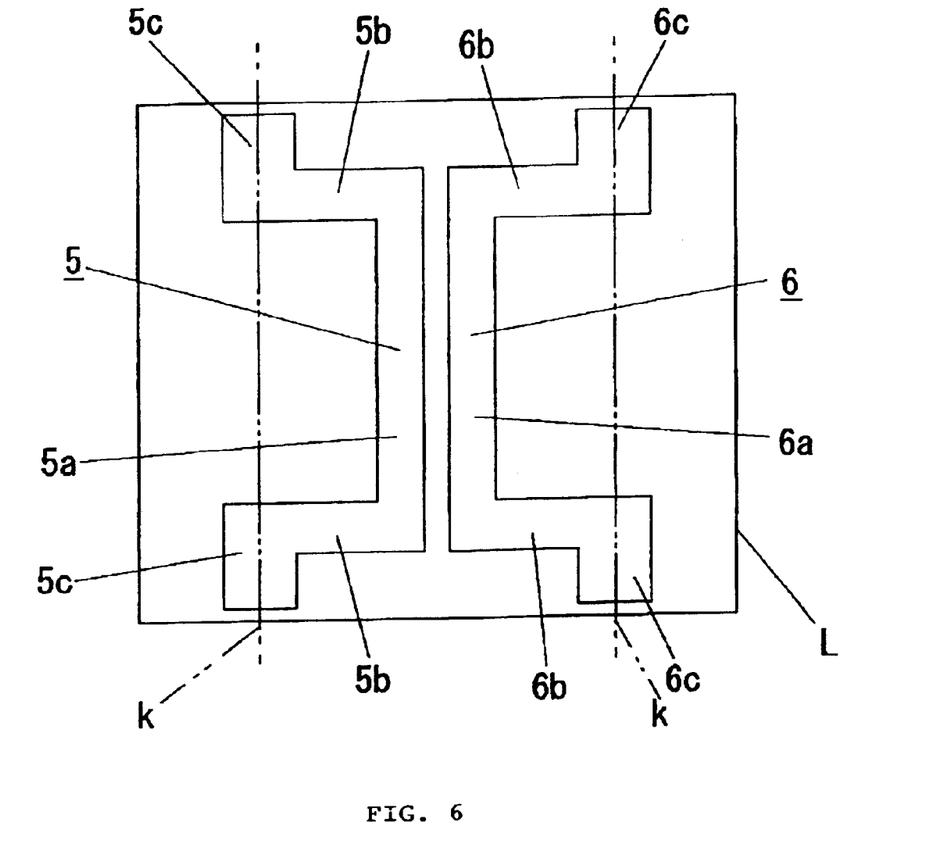
FIG. 6, which was described above, is a plan view of an inductor layer L of the conventional monolithic LC filter of FIGS. 5 and 6.

Considering the inductors in more detail, the first and second resonator inductors are formed of generally C-shaped lines or conductive elements indicated at 5 and 6, respectively, which are formed on a common dielectric layer (inductor layer L) so that portions thereof extend in parallel. More specifically, as shown in FIG. 6, line 5 includes a straight coupling section 5a for establishing a magnetic field coupling, lead sections 5b which extend outwardly from opposite ends of the coupling section 5a, and connection sections 5c, with a first end of each of the connection sections 5c being connected to the corresponding lead section 5b and a second end thereof being connected to a conductor pattern of another dielectric layer. Similarly, line 6 includes a straight coupling section 6a for establishing magnetic field coupling, lead sections 6b which extend outwardly from opposite ends of the coupling section 6a, and connection sections 6c, with a first end of each of the connection sections 6c being connected to the corresponding lead section 6b and a second end thereof being connected to a conductor pattern of another dielectric layer. The coupling section 5a is formed so as to extend parallel to a virtual or imaginary line k passing axially through the connection sections 5c, and the coupling section 6a is formed so as to extend parallel to a virtual or imaginary line k passing axially through the connection sections 6c.

When strong magnetic field coupling is required for a monolithic LC filter having the aforementioned configuration, the lengths of the coupling sections which establish the magnetic field coupling must be increased. However, because there is a strong demand in this field for components of reduced size, a limitation is imposed on the lengths of sides of the dielectric layers on which the coupling sections are provided. Therefore, a problem is encountered in attempting to increase the lengths of the coupling sections, with the result that the requirement for strong magnetic field coupling cannot be fully satisfied with the configuration shown without increasing the size of the corresponding dielectric layer.

SUMMARY OF THE INVENTION

In view of the foregoing, an object of the present invention is to provide a monolithic LC filter which can establish magnetic field coupling of an increased strength as compared with a conventional monolithic LC filter, without a corresponding increase in component size.

In accordance with the present invention, there is provided a monolithic LC filter comprising: a first LC resonance circuit including a first resonator inductor; and a second LC resonance circuit including a second resonator inductor, the first and second resonator inductors comprising conductive lines or elements formed on a common dielectric layer, said lines including respective coupling sections that extend in parallel with each other so as to establish magnetic field coupling between the first and second resonator inductors, each of the lines further including, at opposite ends thereof, a connection section connected to a conductor pattern of a further dielectric layer of the filter, the coupling section of each of the lines being formed so as to be inclined with respect to a virtual line passing axially through the corresponding connection sections.

By virtue of this configuration, the lengths of the coupling sections which establish magnetic field coupling are greater than the length of the coupling sections of a conventional monolithic LC filter (such as that shown in FIGS. 5 and 6), and thus the magnetic field coupling can be strengthened without an attendant increase in the size of the LC filter.

Preferably, the monolithic LC filter is of a rectangular parallelepiped shape, the dielectric layer has a rectangular shape, and the coupling sections are formed on the dielectric layer so as to extend generally along a diagonal of the dielectric layer. This configuration enables the lengths of the coupling sections to be increased to a maximum value in a dielectric layer having a limited surface area.

Preferably, each of the lines has a lead section which extends between one of the connection sections and the corresponding end of the coupling section along an edge of the dielectric layer. This configuration enables the lines to be connected to a conductor pattern of another dielectric layer of the filter while providing efficient utilization of a dielectric layer having a limited surface area.

Further features and advantages of the present invention will be set forth in, or apparent from, the detailed description of preferred embodiments thereof which follows.

DESCRIPTION OF THE PREFERRED EMBODIMENTS

A monolithic LC filter according to one embodiment of the present invention will next be described with reference to the accompanying drawings.

Figure 1:
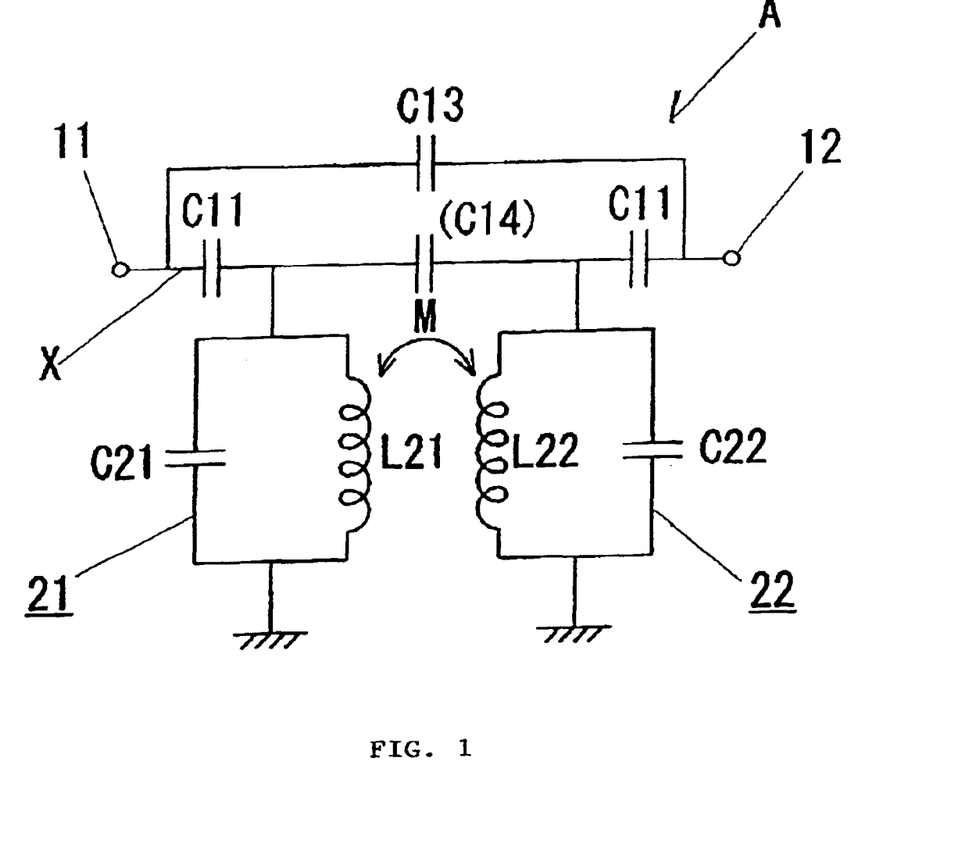
FIG. 1 is a circuit diagram of an equivalent circuit of a monolithic LC filter according to the present invention.

As shown in the schematic circuit diagram of FIG. 1, a monolithic LC filter A according to the present invention includes an input/output line X for connection onto an input terminal 11 and an output terminal 12. The input/output line X, to which a high-frequency voltage is applied, includes two input-output coupling capacitors C11, and an inter-stage coupling capacitor C14 disposed between the input-output coupling capacitors C11. The inter-stage coupling capacitor C14 represents a parasitic capacitance component and has very low capacitance. A peak generation capacitor C13 is connected between the input terminal 11 and the output terminal 12 in parallel with the capacitors C11 and C14.

First and second LC resonance circuits 21 and 22 are connected to respective nodes between the input-output coupling capacitors C11 and the inter-stage coupling capacitor C14. More specifically, one end of the first LC resonance circuit 21 is connected to the node on the side of the input terminal 11, whereas one end of the second LC resonance circuit 22 is connected to the node on the side of the output terminal 12. The other end of the first LC resonance circuit 21 and the other end of the second LC resonance circuit 22 are grounded.

The first LC resonance circuit 21 includes a first resonator capacitor C21 and a first resonator inductor L21, which are connected in parallel. The second LC resonance circuit 22 includes a second resonator capacitor C22 and a second resonator inductor L22, which are also connected in parallel.

As described below, the first resonator inductor L21 of the LC resonance circuit 21 and the second resonator inductor L22 of the LC resonance circuit 22 are provided on a common dielectric layer so as to face or oppose each other, thereby establishing magnetic field coupling M between the inductors L21 and L22.

Figure 2:
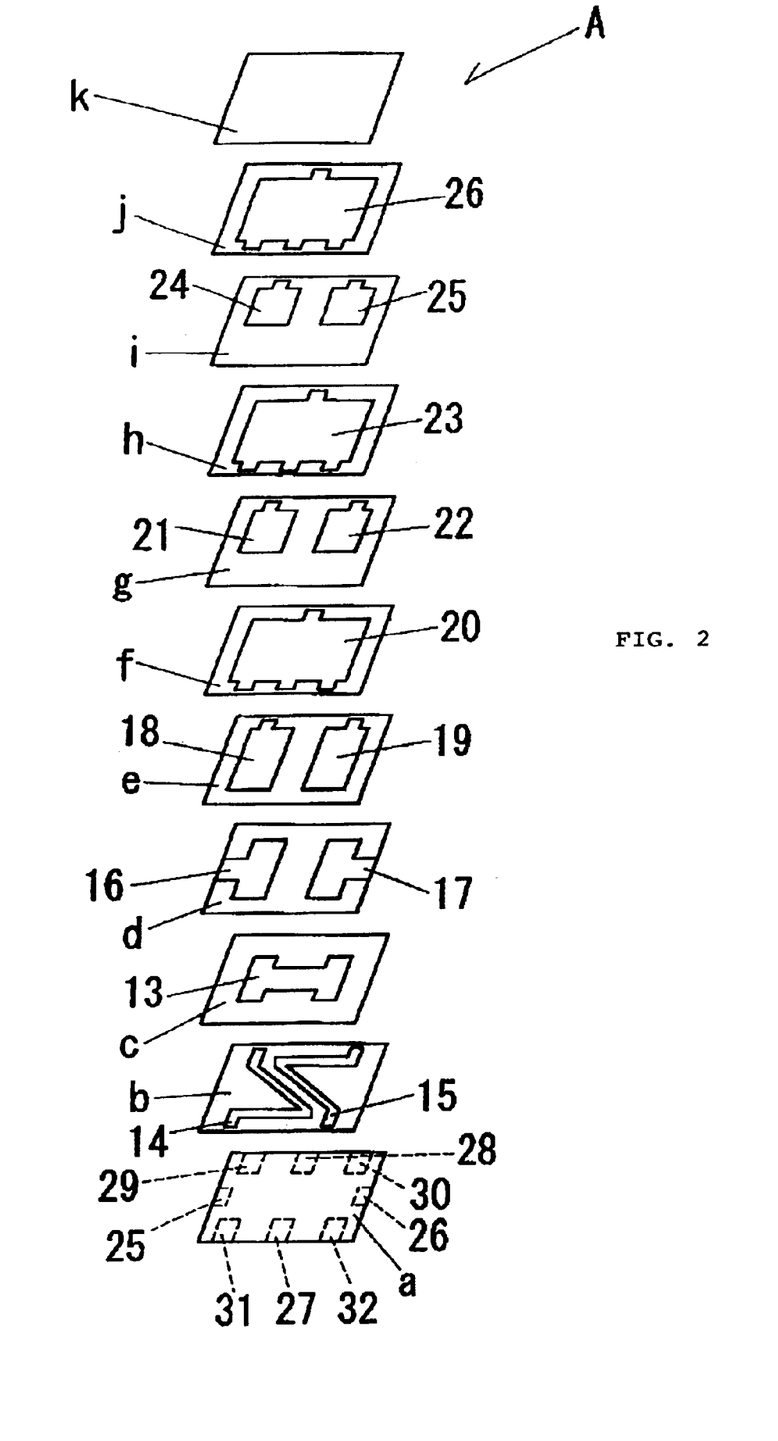
FIG. 2. Is an exploded perspective view of a monolithic LC filter according to a preferred embodiment of the present invention.

Referring to FIG. 2, the monolithic LC filter A of the present invention has a rectangular parallelepiped shape. As shown in FIG. 2, the LC filter A has a structure in which a plurality of rectangular dielectric layers are laminated together. The monolithic LC filter A is fabricated through a process in which a predetermined conductor pattern is formed on each of a plurality of dielectric sheets by means of, for example, screen printing. The plurality of dielectric sheets are then laminated together and the resultant laminated body is then fired. The dielectric sheets are preferably formed of a dielectric material obtained through kneading of a dielectric powder and/or a magnetic powder, together with a binder and other suitable additives. The electric lines or patterns are preferably formed from paste of a conductive material such as Ag, Pd, Cu, Ni, Au, or Ag—Pd. The predetermined conductor patterns formed on the dielectric layers form electrodes and electric paths which constitute the various components of FIG. 1, including the capacitors C11, C13, C14, C21, and C22, and the resonator inductors L21 and L22. The dielectric layers will next be described in more detail.

A terminal layer a forms the bottom layer of the monolithic LC filter A. The terminal layer a includes the following electrodes: an input terminal electrode 25 serving as the input terminal 11; an output terminal electrode 26 serving as the output terminal 12; ground terminal electrodes 27 and 28 which are to be grounded; and terminal electrodes 29, 30, 31, and 32 which are to be connected to predetermined electrical lines or patterns of the LC filter. The electrodes 25 to 32 are formed so as to be exposed at the bottom surface of the monolithic LC filter A. Side-surface electrodes (not shown), adapted to be connected to electrodes of other dielectric layers, extend from the electrodes 25 to 28 along sides of the monolithic LC filter.

On the terminal layer a are successively formed an inductor layer b, capacitor layers c, d, and e, a ground electrode layer f, a capacitor layer g, a ground electrode layer h, a capacitor layer i, and a ground electrode layer j. At the top of the monolithic LC filter A, a dielectric layer k is formed.

Electrical lines or patterns 18, 21, and 24 of the capacitor layers e, g, and i constitute the first resonator capacitor C21 of the first LC resonance circuit while electrical lines or patterns 19, 22, and 25 of the capacitor layers e, g, and i constitute the second resonator capacitor C22 of the second LC resonance circuit. These electrical patterns 18, 19, 21, 22, 24, and 25 are grounded in use.

Electrical lines or patterns 16, 17, 18, and 19 of the capacitor layers d and e constitute the input-output-coupling capacitors C11. Electric paths 13, 16, and 17 of the capacitor layers c and d constitute the peak generation capacitor C13.

A key feature of the present invention will next be described.

Figure 3:
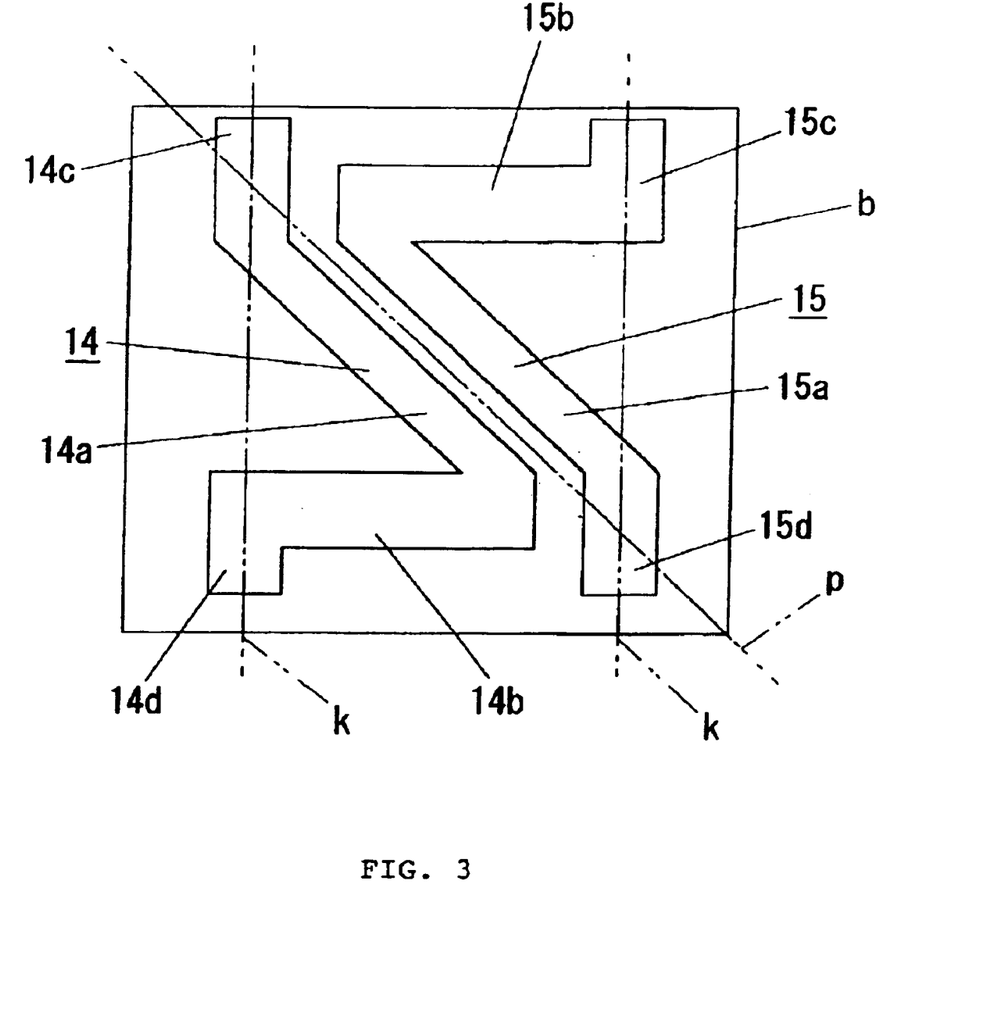
FIG. 3 is a plan view of an inductor layer of the monolithic LC filter of FIG. 2.

The first resonator inductor L21 is formed by a first conductive line or element 14 of the inductor layer b, and the second resonator inductor L22 is formed of a second conductive line or element 15 of the inductor layer b. As shown in FIG. 3, the first line 14 includes the following sections or parts: a first coupling section 14a for establishing the magnetic field coupling M between the resonator inductors L21 and L22, a connection section 14c which is connected to the electrodes 18, 21, and 24 of the capacitor layers e, g, and i via a side-surface electrode (not shown), a connection section 14d which is connected to ground terminal electrodes 20, 23, and 26 of the ground electrode layers f, h, and j; and a lead section 14b which extends between one end of the connection section 14d and the corresponding end of the first coupling section 14a. Similarly, the second conductive line or element 15, which faces or opposes the first line 14, includes the following sections or parts: a second coupling section 15a for establishing the magnetic field coupling M, a connection section 15c which is connected to the electrodes 19, 22, and 25 of the capacitor layers e, g, and i via a side-surface electrode (not shown, a connection section 15d which is connected to the ground terminal electrodes 20, 23, and 26 of the ground electrode layers f, h, and j, and a lead section 15b which extends between one end of the connection section 15c and the corresponding end of the second coupling section 15a.

As shown in FIG. 3, the first coupling section 14a is formed so as to incline at an angle with respect to an imaginary or virtual line k passing axially through the connection sections 14c and 14d, and so as to extend generally along a diagonal p of the rectangular inductor layer b. Similarly to the first coupling section 14a, the second coupling section 15a is also formed so as to incline at an angle with respect to a further imaginary or virtual line k passing axially through the connection sections 15c and 15d, and to extend generally along the diagonal p. The lead section 14b extends from one end of the first coupling section 14a along one edge of the rectangular inductor layer b, and the lead section 15b extends from one end of the second coupling section 15a along another edge of the rectangular inductor layer b.

As described above, in the inductor layer b of the monolithic LC filter of the present invention, each of the coupling sections 14a and 15a is formed so as to incline with respect to the virtual line k, and so as to extend generally along the diagonal p. Therefore, the lengths of the coupling sections 14a and 15a can be increased as compared with the lengths of the corresponding of a conventional monolithic LC filter, without an increase in the size of the LC filter.

Figure 4A:
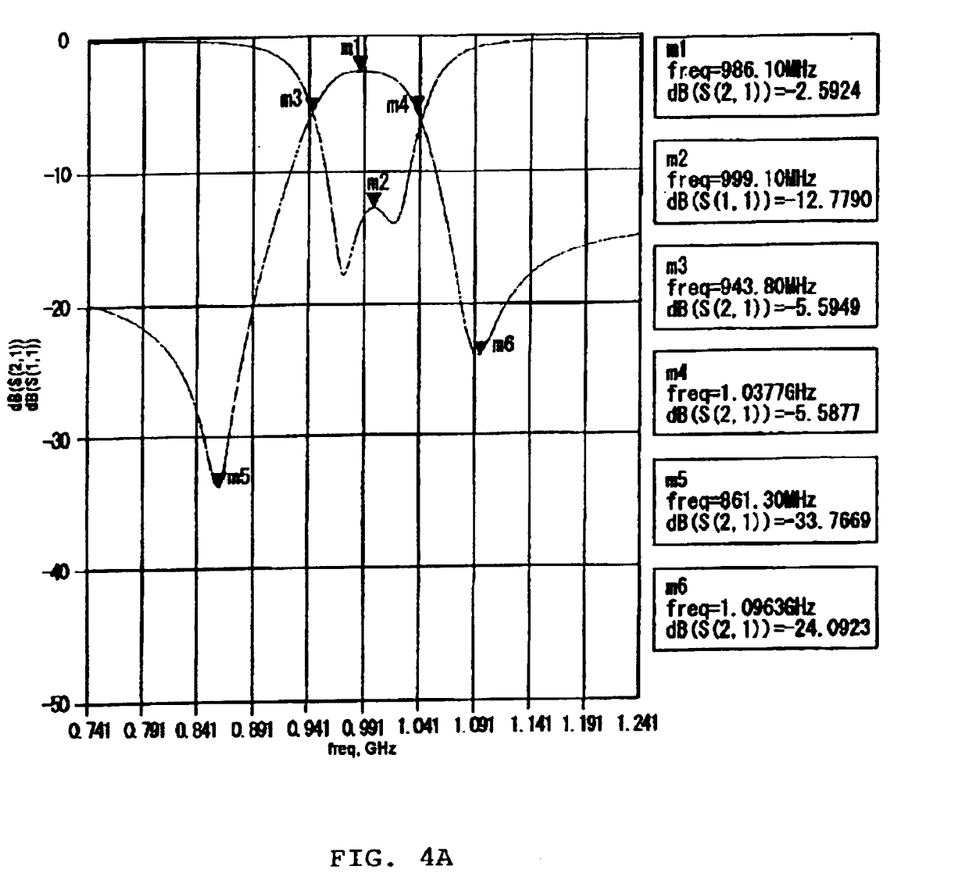
FIG. 4A is a graph showing frequency-attenuation characteristics of the monolithic LC filter of FIGS. 2 and 3.
Figure 4B:
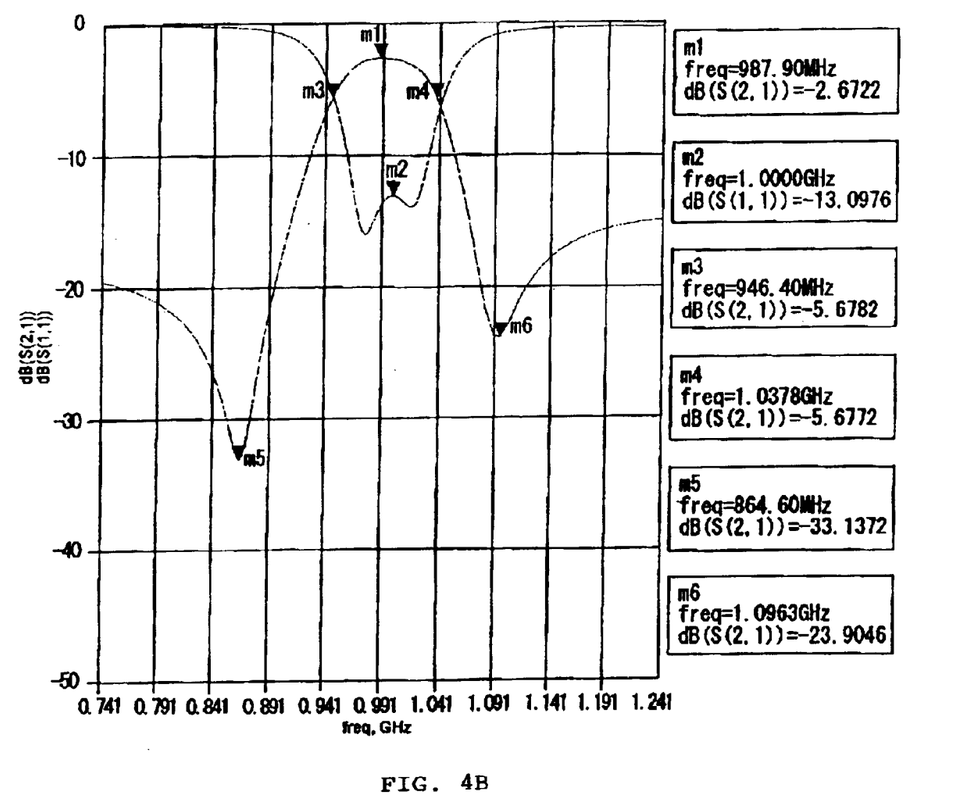
FIG. 4B is a graph showing frequency-attenuation characteristics of a conventional monolithic LC filter.

Referring to FIGS. 4A and 4B, corresponding frequency-attenuation characteristics of the monolithic LC filter A of the present invention including the inductor layer b shown in FIG. 3 (FIG. 4A) are compared with those of the conventional monolithic LC filter A' including the inductor layer L shown in FIG. 6 (FIG. 4B).

Stated differently, FIG. 4A is a graph showing frequency-attenuation characteristics of the monolithic LC filter A of the present invention, while FIG. 4B is a graph showing frequency-attenuation characteristics of the conventional monolithic LC filter A'. A comparison of these graphs reveals that the monolithic LC filter A of the present invention exhibits a stronger magnetic field coupling M, i.e., a magnetic field coupling of increased strength.

The monolithic LC filters A and A' are compared on the basis of the values of I.L. and TOP.L obtained through various tests that have been performed. The conventional monolithic LC filter A' exhibits an I.L. of 2.84 dB and a TOP.L of 2.67 dB, whereas the monolithic LC filter A of the present invention exhibits an I.L. of 2.75 dB and a TOP.L of 2.59 dB. Therefore, I.L and TOP.L of the LC filter of the present invention are greater than those of the conventional LC filter by 3.17% and 3.00%, respectively. Accordingly, these results show that the monolithic LC filter A of the present invention exhibits a magnetic field coupling M having improved frequency-attenuation characteristics.

No particular limitations are imposed on the coupling section 14a of the line 14 formed on the inductor layer b, so long as the coupling section 14a is at least inclined at an angle with respect to the virtual line k passing axially through the connection sections 14c and 14d disposed at the opposite ends of the coupling section 14a. Similarly to the coupling section 14a, no particular limitations are imposed on the coupling section 15a of the line 15, so long as the coupling section 15a is at least inclined with respect to at least the virtual line k passing axially through the connection sections 15c and 15d disposed at the opposite ends of the coupling section 15a. The aforementioned configuration makes the lengths of the coupling sections 14a and 15a greater than the lengths of the coupling sections 5a and 6a of the conventional monolithic LC filter. The present invention also encompasses a configuration in which the lead section 14b is not formed on the line 14, the lead section 15b is not formed on the line 15, the connection sections 14c and 14d are formed at the opposite ends of the coupling section 14a, and the connection sections 15c and 15d are formed at the opposite ends of the coupling section 15a. More generally, the monolithic LC filter A of the present invention is not limited to the specific embodiment illustrated, and may be modified within the scope of the present invention.

In summary, according to the present invention, each of the two parallel-extending coupling sections is formed so as to be inclined at an angle with respect to a virtual line passing axially through the connection sections disposed at the opposite ends of the corresponding detour line. Therefore, the lengths of the coupling sections which establish magnetic field coupling between respective inductors are greater than lengths of the corresponding coupling sections of a conventional monolithic LC filter, and thus the magnetic field coupling can be increased or strengthened without an increase in size of the monolithic LC filter.

When, according to a preferred embodiment, the coupling sections are formed on the dielectric layer so as to extend generally along a diagonal of the dielectric layer, the lengths of the coupling sections can be increased to a maximum level for a dielectric layer having a limited surface area without an increase in size of the monolithic LC filter.

When, according to a further preferred embodiment, each of the conductive lines has a lead section which extends between one of the connection sections and the corresponding end of the coupling section along an edge of the dielectric layer, the conductive line can be connected to a conductor pattern of another dielectric layer so as to provide efficient utilization of a dielectric layer having a limited surface area.

Although the invention has been described above in relation to preferred embodiments thereof, it will be understood by those skilled in the art that variations and modifications can be effected in these preferred embodiments without departing from the scope and spirit of the invention.

What is claimed:

1. A monolithic LC filter comprising a first LC resonance circuit including a first resonator inductor, and a second LC resonance circuit including a second resonator inductor, the first and second resonator inductors comprising conductive lines formed on a common dielectric layer, said lines including respective coupling sections extending in parallel so as to establish magnetic field coupling between the first and second resonator inductors, each of the lines including, at opposite ends thereof, a connection section connected to a conductor pattern of a further dielectric layer, the coupling section of each of the lines being formed so as to be inclined at an angle with respect to an imaginary line passing axially through the corresponding connection sections.

2. A monolithic LC filter according to claim 1, wherein the filter is of a rectangular parallelepiped shape, wherein the dielectric layer has a rectangular shape, and wherein the coupling sections formed on the dielectric layer extend generally along a diagonal of the dielectric layer.

3. A monolithic LC filter according to claim 1, wherein each of the conductive lines includes a lead section extending between one of the connection sections and a corresponding end of the coupling section along an edge of the dielectric layer.

4. A monolithic LC filter according to claim 2, wherein each of the conductive lines includes a lead section extending between one of the connection sections and a corresponding end of the coupling section along an edge of the dielectric layer.

5. A monolithic LC filter of a rectangular parallelepiped shape, and comprising a first LC resonance circuit including a first resonator inductor; and a second LC resonance circuit including a second resonator inductor, the first and second resonator inductors comprising conductive lines formed on a common dielectric layer, said lines including respective coupling sections extending in parallel so as to establish magnetic field coupling between the first and second resonator inductors, each of the lines having, at opposite ends thereof, a connection section connected to a conductor pattern of another dielectric layer, the dielectric layer being of a rectangular shape having opposed parallel sides, and the coupling section of each of the lines being inclined at an angle with respect to the sides of the dielectric layer.

* * * * *